US008280655B2

(12) United States Patent  (10) Patent No.: US 8,280,655 B2
Foran  (45) Date of Patent: Oct. 2, 2012

(54) DIGITAL POWER MONITORING CIRCUIT AND SYSTEM

(75) Inventor: Ryan Foran, Bullock, NC (US)

(73) Assignee: International Rectifier Corporation, El Segundo, CA (US)

( * ) Notice: Subject to any disclaimer, the term of this patent is extended or adjusted under 35 U.S.C. 154(b) by 828 days.

(21) Appl. No.: 12/040,381

(22) Filed: Feb. 29, 2008

(65) Prior Publication Data

US 2008/0234954 A1  Sep. 25, 2008

Related U.S. Application Data

(60) Provisional application No. 60/904,213, filed on Mar. 1, 2007.

(51) Int. Cl.
*G01R 21/00* (2006.01)
*G01R 23/02* (2006.01)
(52) U.S. Cl. .................. 702/60; 324/76.39
(58) Field of Classification Search .............. 702/57, 702/60–62, 64–65, 189–190, 81, 84, 107, 702/182–183, 199; 327/104, 124, 530–532, 327/534–535, 544; 324/508, 771, 113, 76.11, 324/76.39, 600; 323/206–211, 355, 363
See application file for complete search history.

(56) References Cited

U.S. PATENT DOCUMENTS

| 4,396,986 | A | * | 8/1983 | Salesky ..................... 700/298 |
| 4,746,899 | A | * | 5/1988 | Swanson et al. ............ 341/122 |
| 5,301,121 | A | * | 4/1994 | Garverick et al. ............ 702/60 |
| 5,317,116 | A | * | 5/1994 | Tabata et al. .......... 219/130.51 |
| 5,345,236 | A | * | 9/1994 | Sramek, Jr. ................. 341/144 |
| 6,236,872 | B1 | * | 5/2001 | Diab et al. ................... 600/323 |
| 7,050,208 | B2 | * | 5/2006 | Overbeck ................. 359/201.1 |
| 7,343,186 | B2 | * | 3/2008 | Lamego et al. ............. 600/323 |
| 2005/0123144 | A1 | * | 6/2005 | Wallace ...................... 381/56 |
| 2005/0285584 | A1 | * | 12/2005 | Kwan ......................... 323/283 |
| 2006/0071610 | A1 | * | 4/2006 | Dluzniak ................ 315/209 R |

* cited by examiner

*Primary Examiner* — Toan M Le
(74) *Attorney, Agent, or Firm* — Farjami & Farjami LLP

(57) ABSTRACT

A digital power monitoring circuit for monitoring power through an output inductor of a switching power supply in accordance with an embodiment of the present application includes a first analog to digital converter receiving a current sense signal indicative of the current through the output inductor and providing a first digital signal including information regarding the current through the output inductor, a second analog to digital converter receiving a signal indicative of the output voltage of the switching power supply and providing a second digital signal containing information regarding the output voltage of the switching power supply; and a convolver circuit operable to receive the first digital signal and the second digital signal and to provide a third digital signal including information regarding the power through the output inductor based on the first and second digital signals.

16 Claims, 12 Drawing Sheets

| Ones Density | Signal | B | S1 | S2 | S3 | S4 | S5 | S6 | S7 | Actual |
|---|---|---|---|---|---|---|---|---|---|---|
| 0.5 | DI | 0 | 1 | 0 | 1 | 0 | 1 | 0 | 1 | |
| 1.0 | DV | 1 | 1 | 1 | 1 | 1 | 1 | 1 | 1 | |
| product 0.5 | convolution | 0 | 1 | 0 | 1 | 0 | 1 | 0 | 1 | 0.5 |

FIG. 8

| Ones Density | Signal | B | S1 | S2 | S3 | S4 | S5 | S6 | S7 | Actual |
|---|---|---|---|---|---|---|---|---|---|---|
| 0.5 | DI | 0 | 1 | 0 | 1 | 0 | 1 | 0 | 1 | |
| 0.5 | DV | 0 | 0 | 1 | 0 | 1 | 0 | 1 | 0 | |
| product 0.25 | convolution | 0 | 0 | 0 | 0 | 0 | 0 | 0 | 0 | 0.0 |

FIG. 9A

| Ones Density | Signal | B | S1 | S2 | S3 | S4 | S5 | S6 | S7 | Actual |
|---|---|---|---|---|---|---|---|---|---|---|
| 0.5 | DI | 0 | 1 | 0 | 1 | 0 | 1 | 0 | 1 | |
| 0.5 | DV | 0 | 1 | 0 | 1 | 0 | 1 | 0 | 1 | |
| product 0.25 | convolution | 0 | 1 | 0 | 1 | 0 | 1 | 0 | 1 | 0.5 |

FIG. 9B

DIGITAL POWER MONITORING CIRCUIT AND SYSTEM

CROSS-REFERENCE TO RELATED APPLICATIONS

The present application claims benefit of and priority to U.S. Provisional Patent Application Ser. No. 60/904,213 filed Mar. 1, 2007 entitled DIGITAL POWER MONITOR, the entire contents of which are hereby incorporated by reference herein.

BACKGROUND

1. Field of the Disclosure

The present invention relates to a digital power monitoring circuit and system to provide digital power monitoring, including in a switching power supply. More specifically, the digital power monitoring circuit utilizes two delta sigma analog to digital converters (ADC) to provide first and second digital signals containing information about the current through the output inductor and the output voltage, respectively, of the switching power supply and a convolver circuit to provide a third digital signal indicating the power dissipated through the output inductor based on first and second digital signals.

2. Related Art

Generally, digital power monitoring (DPM) involves calculating the power delivered thru an inductor in a switching power supply over an averaging interval. Measuring the power delivered through an inductor can be difficult in switching power supplies, however, information about the power can be used to monitor the condition of the load, to optimize load conditions, to maximize efficiency, and for thermal protection. Thus, it is very useful to monitor this parameter, particularly in a power supply for a microprocessor, for example.

FIG. 1 illustrates a simplified diagram of an exemplary switching power supply 10, specifically a typical buck converter. While FIG. 1 illustrates a buck converter, a variety of switching power supply topologies and architectures share the following common features: switch(s) (Q1, Q2), an output inductor (L) and an output filter capacitor (Cout). In all cases, the voltage across the inductor L is switched between two nodes to control the output voltage (Vout) provided across the output capacitor (Cout). Switching power supplies are popular in a variety of applications and are often chosen for their high efficiency, ability to create a wide variety of voltages, and compactness.

The current in an ideal inductor changes in proportion to the voltage applied across it. That is, in an ideal inductor, the following is true:

$$V=L*di/dt \quad \text{Equation 1}$$

However, the absolute current in an ideal inductor is independent from the voltage across it. In order to have knowledge of the absolute current in the inductor, it is necessary to accurately integrate the voltage applied across the inductor and know the initial conditions, or measure the current with a separate sense element.

Resistor current sensing is a common method of creating a voltage signal which is proportional to the current flowing in an inductor of a switching power supply. As can be seen with reference to FIG. 2, in this method, a resistor (Rsense) is put in series with the output inductor (L) of the switching power supply 10, and generates a voltage (Vcs) across it (following Ohm's Law) which is proportional to the current (Iinductor) in the inductor (L). The current across the resistor Rsense may thus be expressed as $$Vcs-Vout = Iinductor*Rsense \quad \text{Equation 2}$$

The voltage Vcs−Vout is proportional to the inductor current (Iinductor). From this, the following equation can be used to determine the inductor current:

$$Iinductor=(Vcs-Vout)/Rsense \quad \text{Equation 3}$$

Another method for providing a voltage indicative of a current in an inductor is inductor DC resistance (DCR) current sensing. DCR current sensing typically relies on the copper winding resistance of the inductor (L) which has a significant temperature coefficient. If an ideal inductor were used, the average phase voltage (Vphase) at the switching node would be equal to the output voltage (Vout). However, in realized power supplies there is a small, but measurable difference between the average phase voltage (Vphase) and the output voltage (Vout). This difference is the result of the real intrinsic resistance (DCR) of the inductor L, for example. This difference can be measured by filtering the phase voltage (Vphase) at the switching node and comparing it to the output voltage (Vout). This is described further with reference to FIG. 3. It is noted that the time constant of the chosen for the filter formed by the resistor Rcs and the capacitor Ccs should match the time constant of the inductor (L) and the intrinsic resistance DCR. This will allow Vcs−Vout to be correct even during transients, that is, changes in the switching duty cycle of the power supply 10.

Since the average drop across the inductor L is proportional to the voltage drop across the parasitic winding resistance, the following DCR equations result:

$$\text{Average}(Vphase)-Vout=Iinductor*DCR, \text{ and} \quad \text{Equation 4}$$

$$\text{Average}(Vphase)=Vcs; \quad \text{Equation 5}$$

Thus, $$Vcs-Vout=Iinductor*DCR. \quad \text{Equation 6}$$

The voltage Vcs−Vout can be viewed as being proportional to the inductor current (Iinductor) such that the inductor current may be determined as follows:

$$Iinductor=Vcs-Vout/DCR. \quad \text{Equation 7}$$

A useful tool in power supply monitoring/controlling, in general, is a delta sigma type analog to digital converter (ADC) circuit. A delta sigma ADC derives a synchronous (clocked) stream of zeros and ones in which the ratio of ones to zeros, that is, the ones density, contains information regarding the input signal which is digitized. Generally, the ones are counted over a specific conversion interval in a digital filter. The count at the end of the conversion interval is proportional to the signal being digitized. Thus, the average of the signal over the conversion signal is given by the count at the end of the averaging. Since delta sigma digital conversion is generally well known, it is not discussed in further detail herein. However, the output Dx of the delta sigma type ADC circuit may be of particular use in a monitoring circuit since the output Dx is a continuous steam of synchronous (clocked) bits where the ratio of ones (one's density) contains the relevant information regarding the input signal which is digitized. FIG. 4 illustrates an exemplary embodiment of a delta sigma ADC circuit 400.

FIG. 6 illustrates an example of a switching power supply incorporating digital current sensing (DCS) in the form of a modified delta sigma ADC 400' to facilitate negative inductor currents as well as positive inductor current. Specifically, in FIG. 6 a delta sigma type ADC circuit 400' is modified to measure both positive and negative output inductor currents. The circuit of FIG. 6 is also described in assignee International Rectifier Corporation's copending U.S. application Ser. No. 12/037,380 filed Feb. 26, 2008, entitled DIGITAL CURRENT SENSE, the entire contents of which are incorporated by reference herein. It is noted that since the feedback loop (including the comparator, flip-flop and the switched current source) holds the inputs to the comparator to be substantially equal, the analysis of the steady state operation of this circuit is simplified as follows:

$$Vcs=Vout \qquad \text{Equation 8}$$

Summing the current at the node Vcs, the current flowing through Rcs=average current flowing through the switched current source 600. Since Vcs=Vout we get:

$$\text{Average}(Vphase)-Vout/Rcs+Idc=Iswitch*DI \qquad \text{Equation 10}$$

When we substitute Vout for Vcs the result is:

$$Iinductor*DCR/Rcs+Idc=Iswitch*DI \qquad \text{Equation 11}$$

Since the current Iswitch is defined as Vref/Rref, and Idc is defined as Vref/Rref*K, the result is:

$$Iinductor*DCR/Rcs+(Vref/Rref*K)=Vref/(Rref*K) \qquad \text{Equation 12}$$

Solving for DI, the result is:

$$DI=Iinductor*DCR*(Rref/Rcs)*1/Vref+1/K \qquad \text{Equation 13}$$

Thus, DI is a function of the inductor current (Iinductor) and constants. Further, it is noted that Rref is the opposite temperature coefficient of DCR and thus, this formula is temperature independent, which is preferred. In addition, it is noted that DI has an "offset" 1/K in its duty ratio. That is, at zero inductor current, DI will still give a positive duty ratio of 1/K. For example, if K were 2, then at zero current, the duty ration DI would be 50% (50% ones). Solving for the inductor current Iinductor:

$$Iinductor=(DI-1/k)*Vref/DCR)*(Rcs/Rref). \qquad \text{Equation 14}$$

It is noted that similar functionality can be accomplished by switching the location of the DC current source 606 and the switch current source 600 (with an inverter required between the output of the D flip flop and the switch current source).

While specific embodiments of a delta sigma ADC circuit have been explored, it is noted that any suitable delta sigma ADC front end may be used to derive the bit stream DI which is proportional to the inductor current.

Thus, there are several ways in which provide a digital signal representing a sensed parameter of the power supply. It would be beneficial to provide a reliable digital power monitoring circuit with low power and a reduced component count.

SUMMARY OF THE INVENTION

It is an object of the present invention to provide an accurate digital power monitoring circuit that is relatively low cost and low power and minimizes component count while providing true power monitoring and good accuracy even during transients.

A digital power monitoring circuit for monitoring power through an output inductor of a switching power supply in accordance with an embodiment of the present application includes a first analog to digital converter receiving a current sense signal indicative of the current through the output inductor and providing a first digital signal including information regarding the current through the output inductor, a second analog to digital converter receiving a signal indicative of the output voltage of the switching power supply and providing a second digital signal containing information regarding the output voltage of the switching power supply; and a convolver circuit operable to receive the first digital signal and the second digital signal and to provide a third digital signal including information regarding the power through the output inductor based on the first and second digital signals. The digital power monitoring circuit may also include a digital filter, preferably in the form of a counter, operable to provide a digital word that is proportional to power.

Other features and advantages of the present invention will become apparent from the following description of the invention which refers to the accompanying drawings.

BRIEF DESCRIPTION OF THE DRAWING(S)

FIG. 8 is a table illustrating individual bits of a first, second and third digital data signal in the digital power monitoring circuit of FIG. 7;

FIGS. 9A and 9B are tables illustrating individual bits of a first second and third digital data signals in the digital power monitoring circuit of FIG. 7 where the first and second digital data streams are out of phase;

Figure 7:
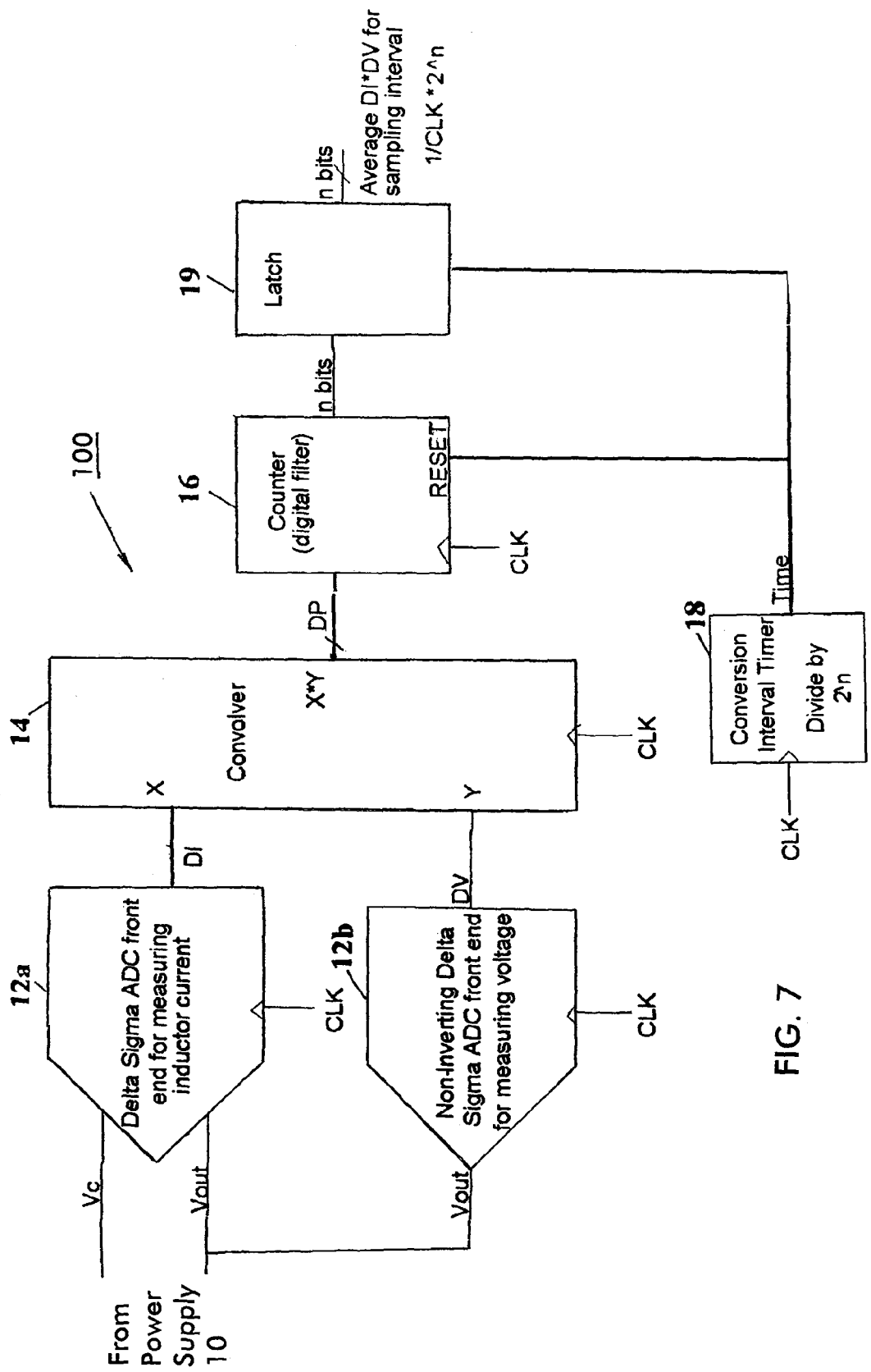
FIG. 7 is a circuit diagram of a digital power monitoring circuit in accordance with an embodiment of the present application.
Figure 10A:
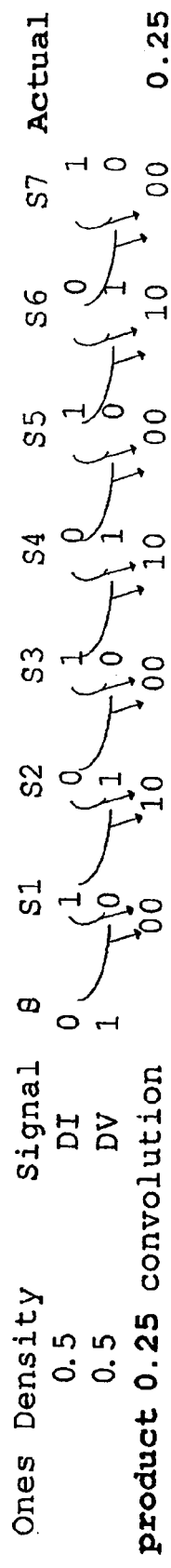
Figure 10B:
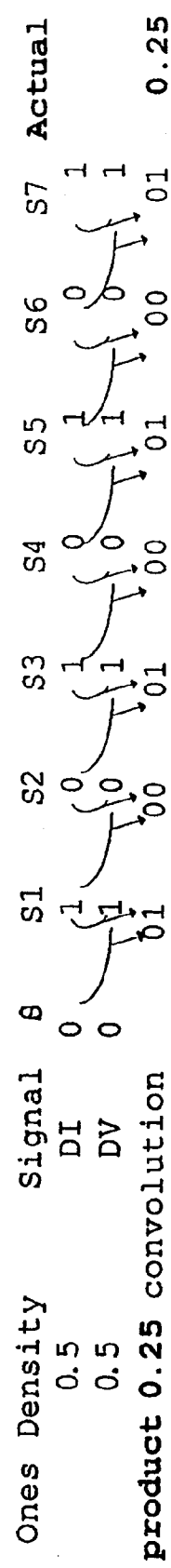
Figure 11:
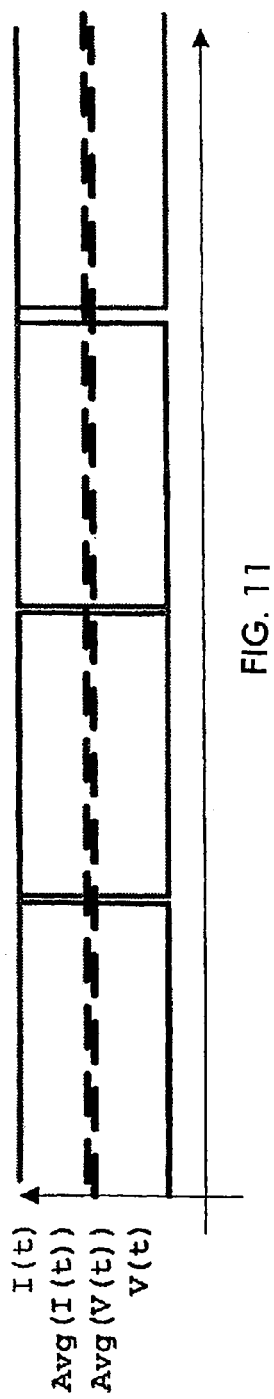
Figure 12:
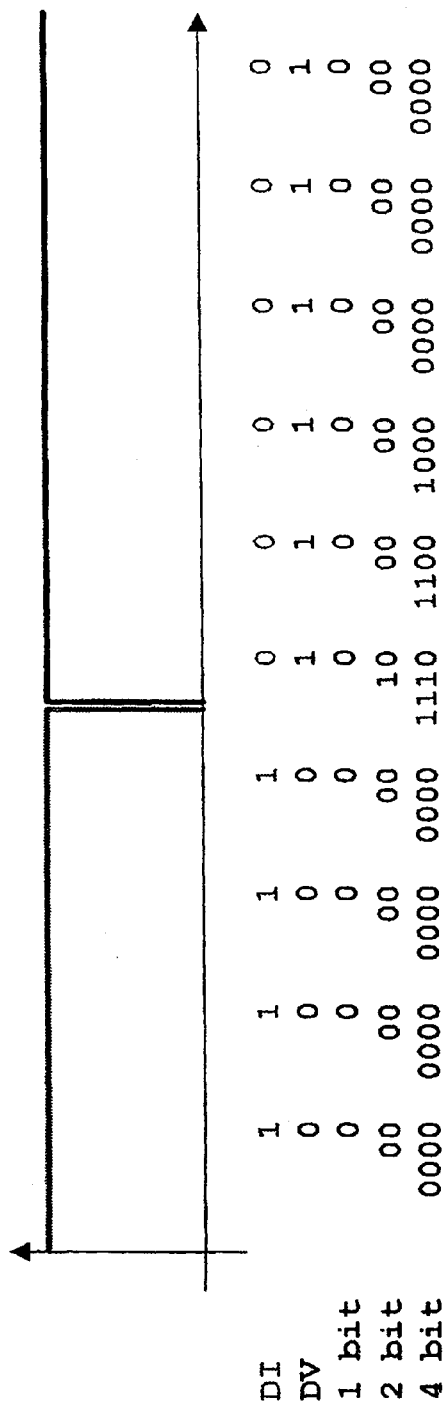
Figure 13:
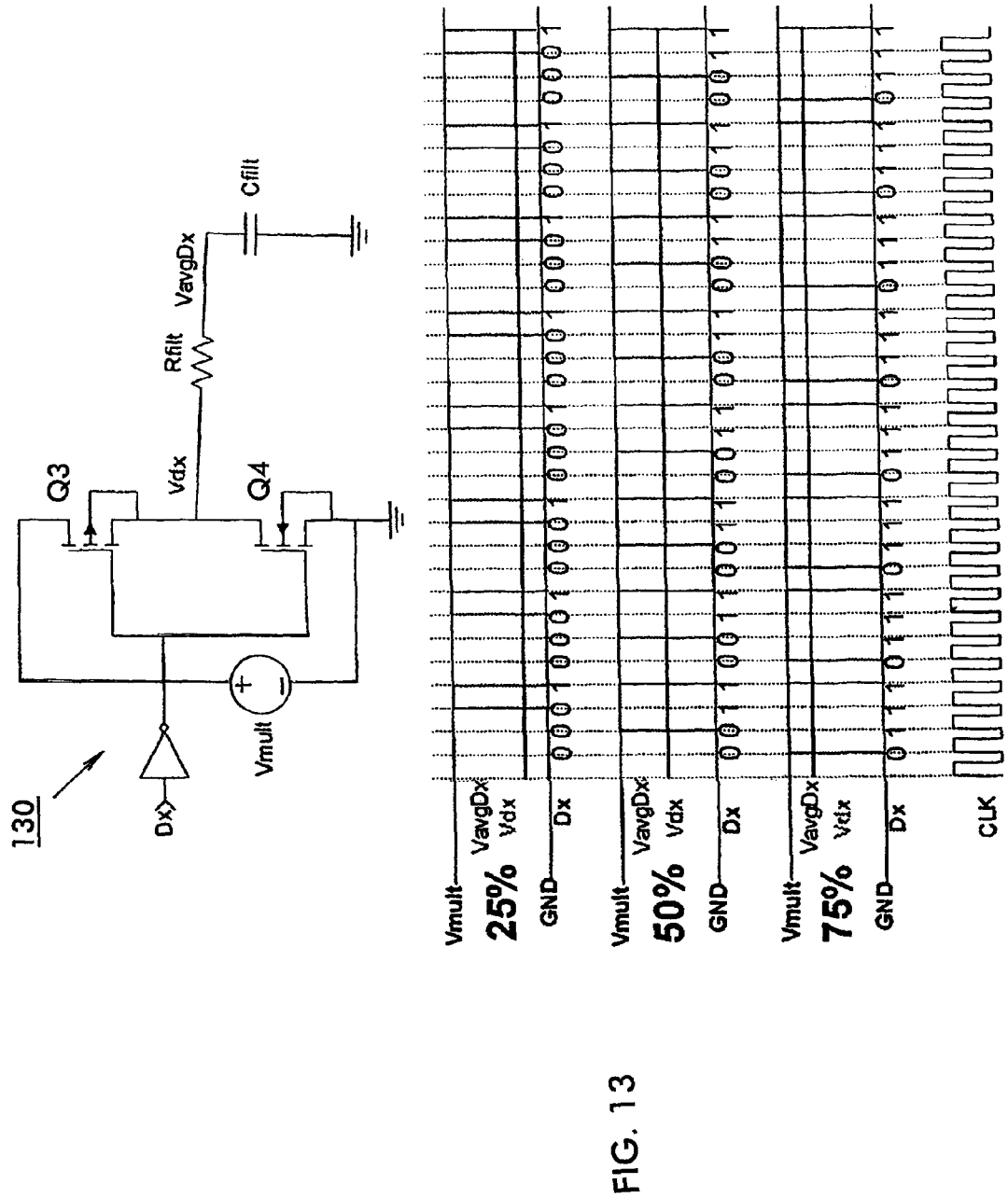
Figure 14:
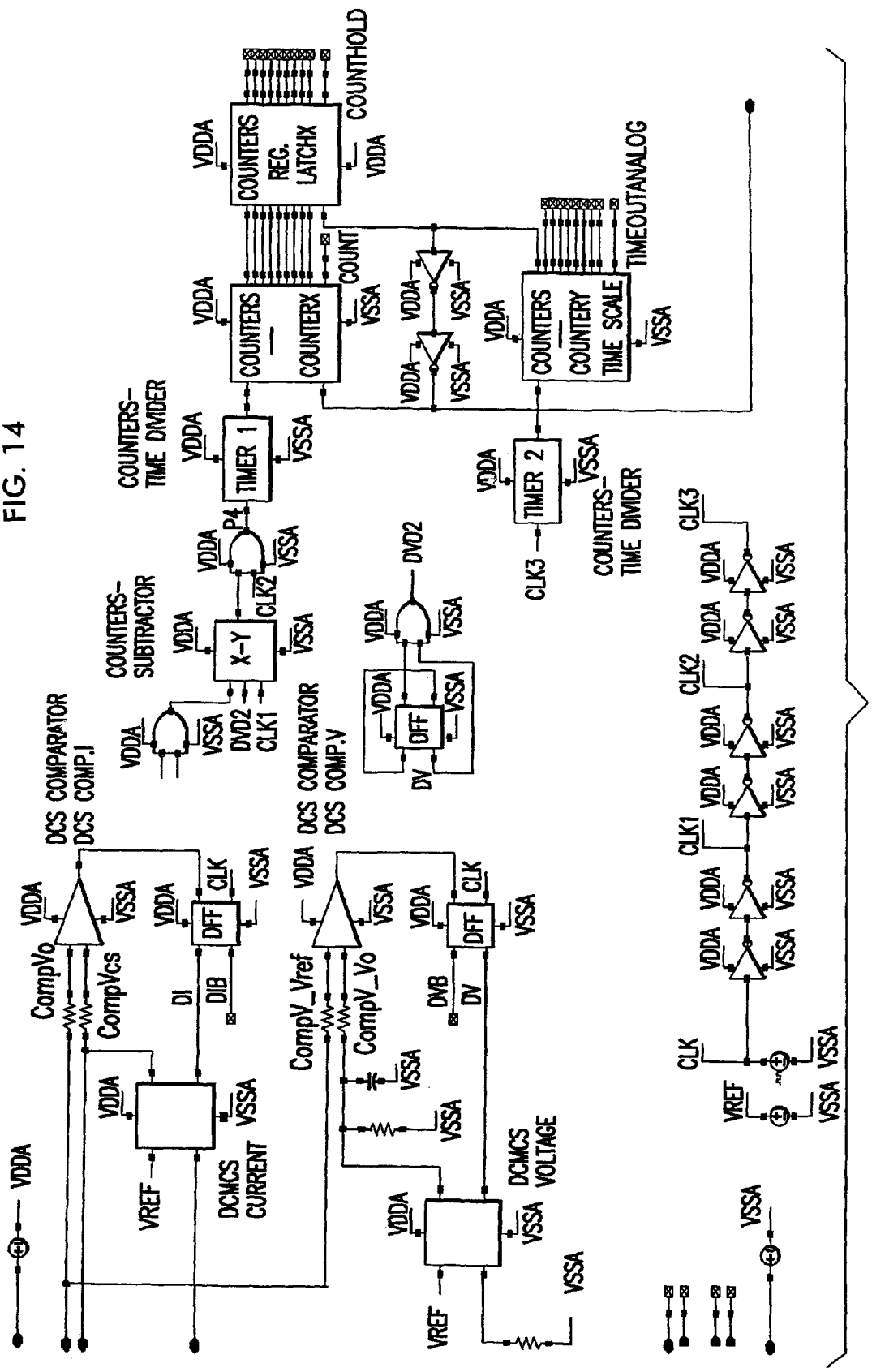

FIGS. 10A, and 10B are tables illustrating individual bits of a first second and third digital data signals in the digital power monitoring circuit of FIG. 7 where two bit convolution is used;

FIG. 11 illustrates two continuous time signals I(t) and V(t) and their averaged signals (Avg(I(t)), Avg(V(t)));

FIG. 12 illustrates the measurable non-instantaneous interval over which convolution of the first and second digital signals of the circuit of FIG. 7 acts;

FIG. 13 illustrates a conversion circuit that may be used to convert one of the first, second and third digital signals of digital power monitoring circuit of FIG. 7 into an analog signal;

FIG. 14 illustrates a schematic of a circuit used to simulate the digital power monitoring circuit of the present application.

Figure 15:
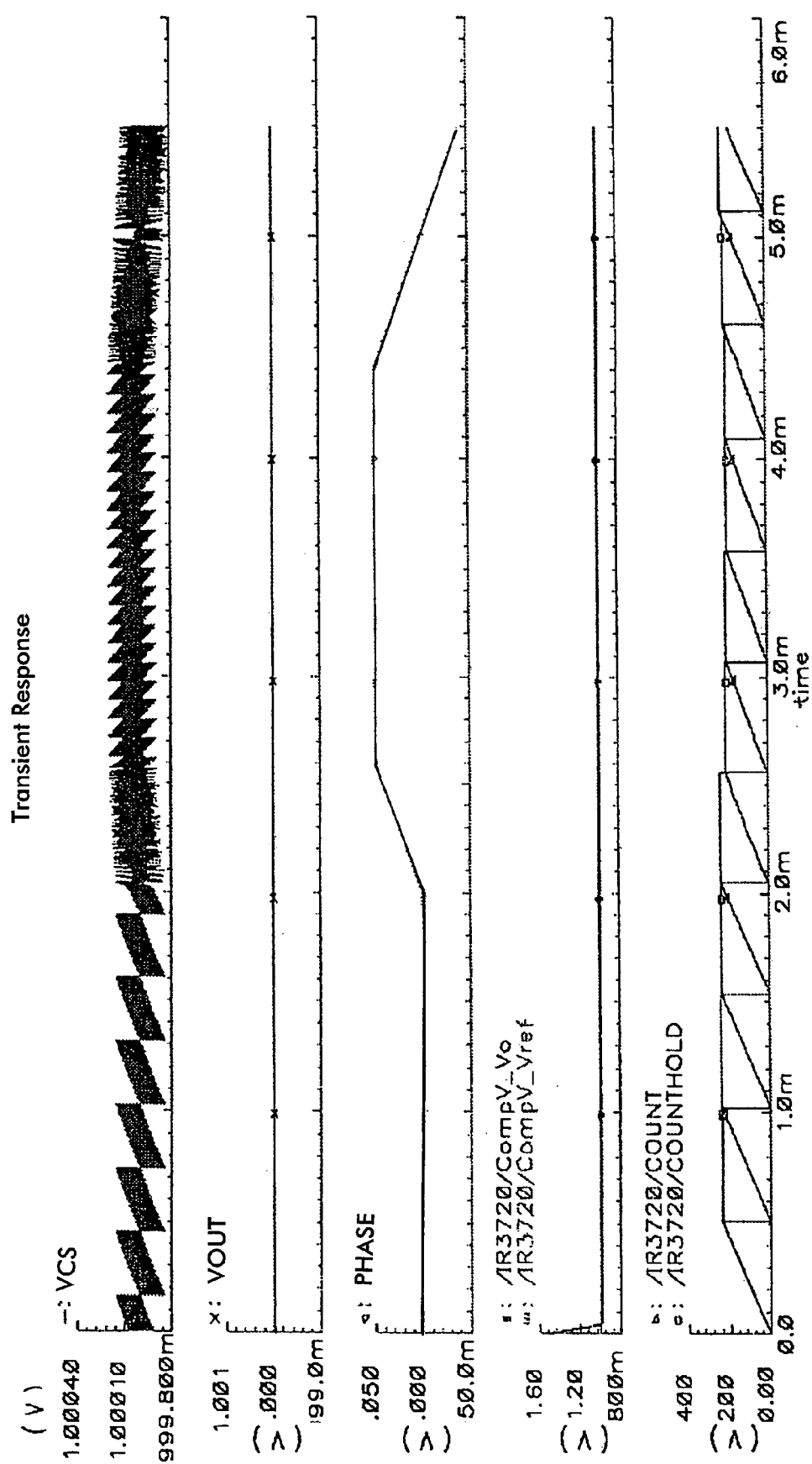

FIG. 15 illustrates waveforms derived from the simulation circuit of FIG. 14.

Figure 16:
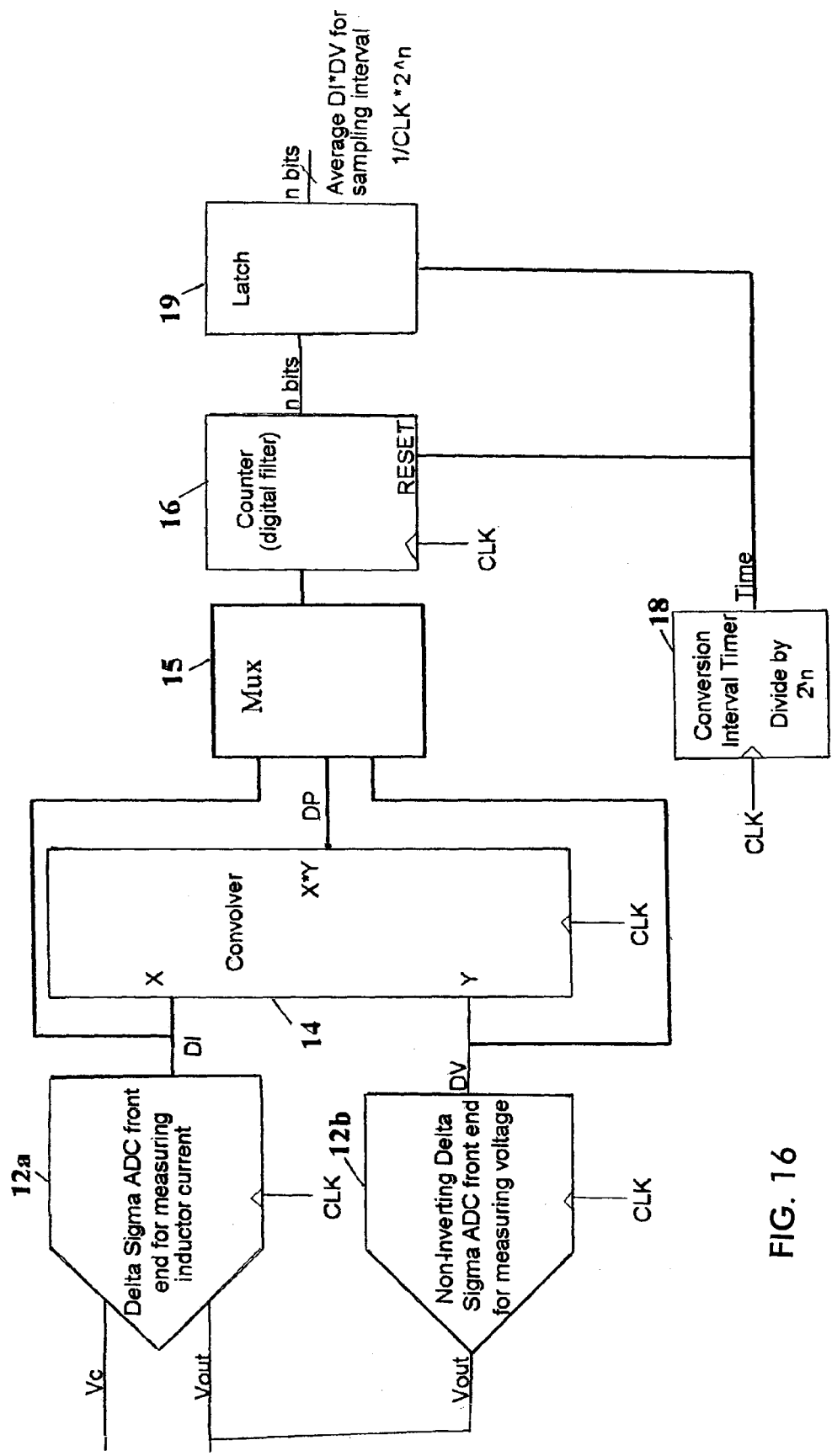

FIG. 16 is a circuit diagram of a digital power monitoring circuit in accordance with another embodiment of the present application;

DETAILED DESCRIPTION OF PREFERRED EMBODIMENTS

Figure 1:
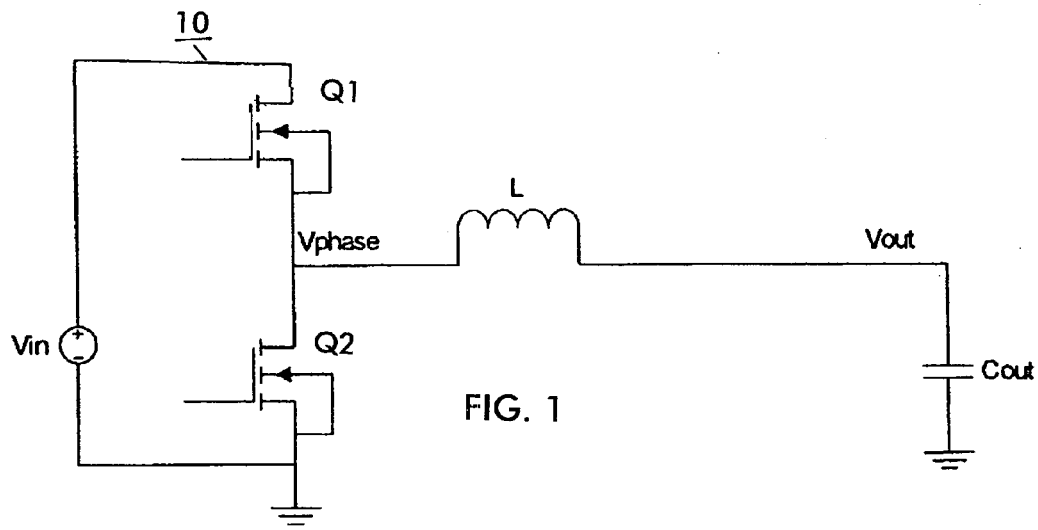
FIG. 1 is a circuit diagram of a commonly known buck switching power supply.

A digital power monitoring circuit 100 in accordance with an embodiment of the present application is described with reference to FIG. 7. The monitoring circuit 100 may be used to monitor the power through the output inductor L of the switching power supply 10 of FIG. 1, for example. The circuit 100 utilizes two delta sigma ADC circuits 12a, 12b to measure inductor current (Iinductor) and output voltage (Vout) of the power supply. The delta sigma ADC 12a measures current in the inductor L (Iinductor) while the second ADC 12b measures the output voltage (Vout) of the switching power supply 10. A convolver circuit 14 is provided to convolve the outputs DI, DV of the ADC's 12a, 12b, together to provide the digital signal DP which indicates the power though the output inductor L. A counter 16, an interval circuit 18 and latch 19 may be used as a digital filter to average the output of the ADC's 12a, 12b or the convolver circuit 14.

Figure 5:
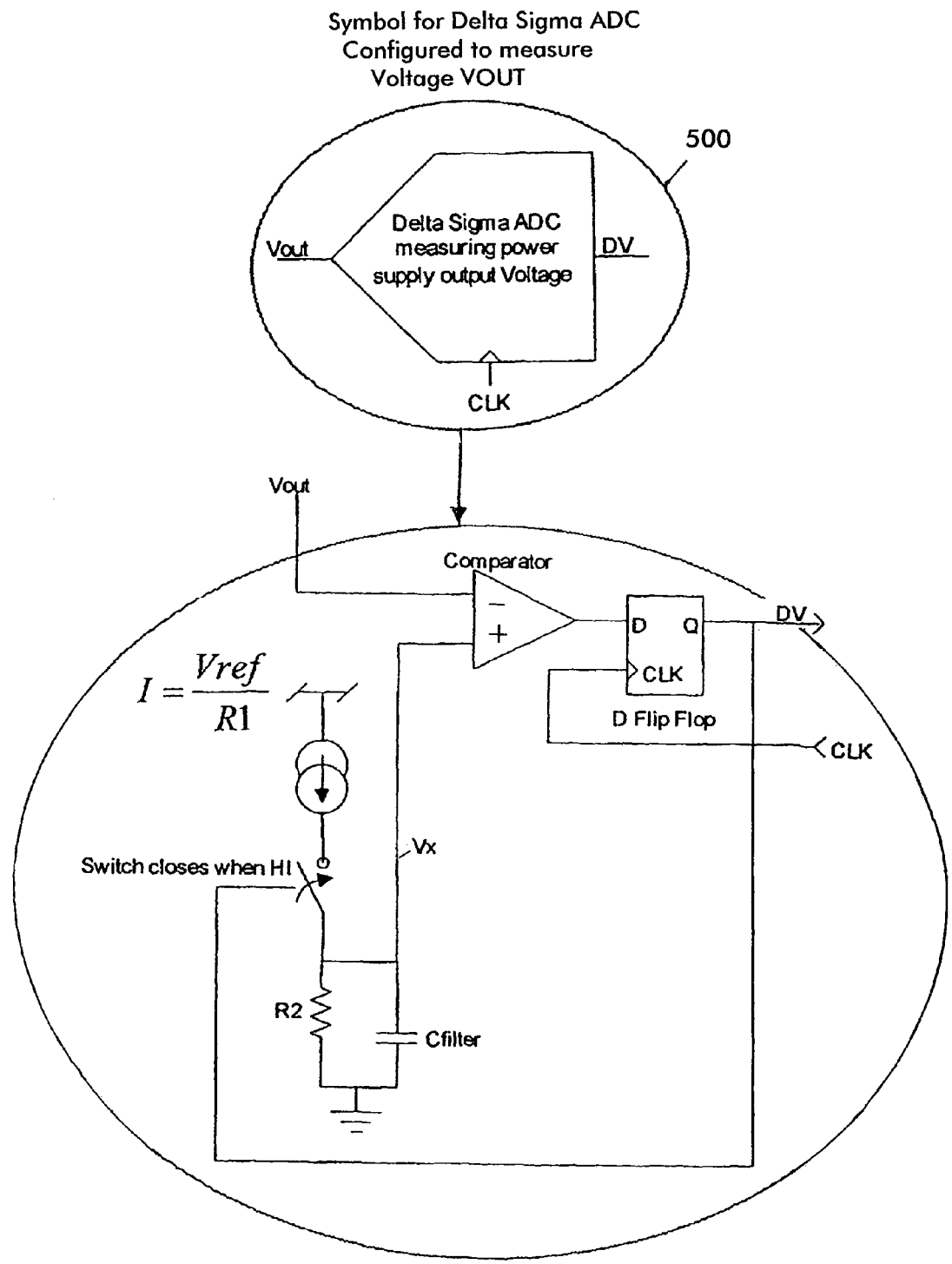
FIG. 5 is a circuit diagram of a circuit for sensing an output voltage of a switching power source.
Figure 6:
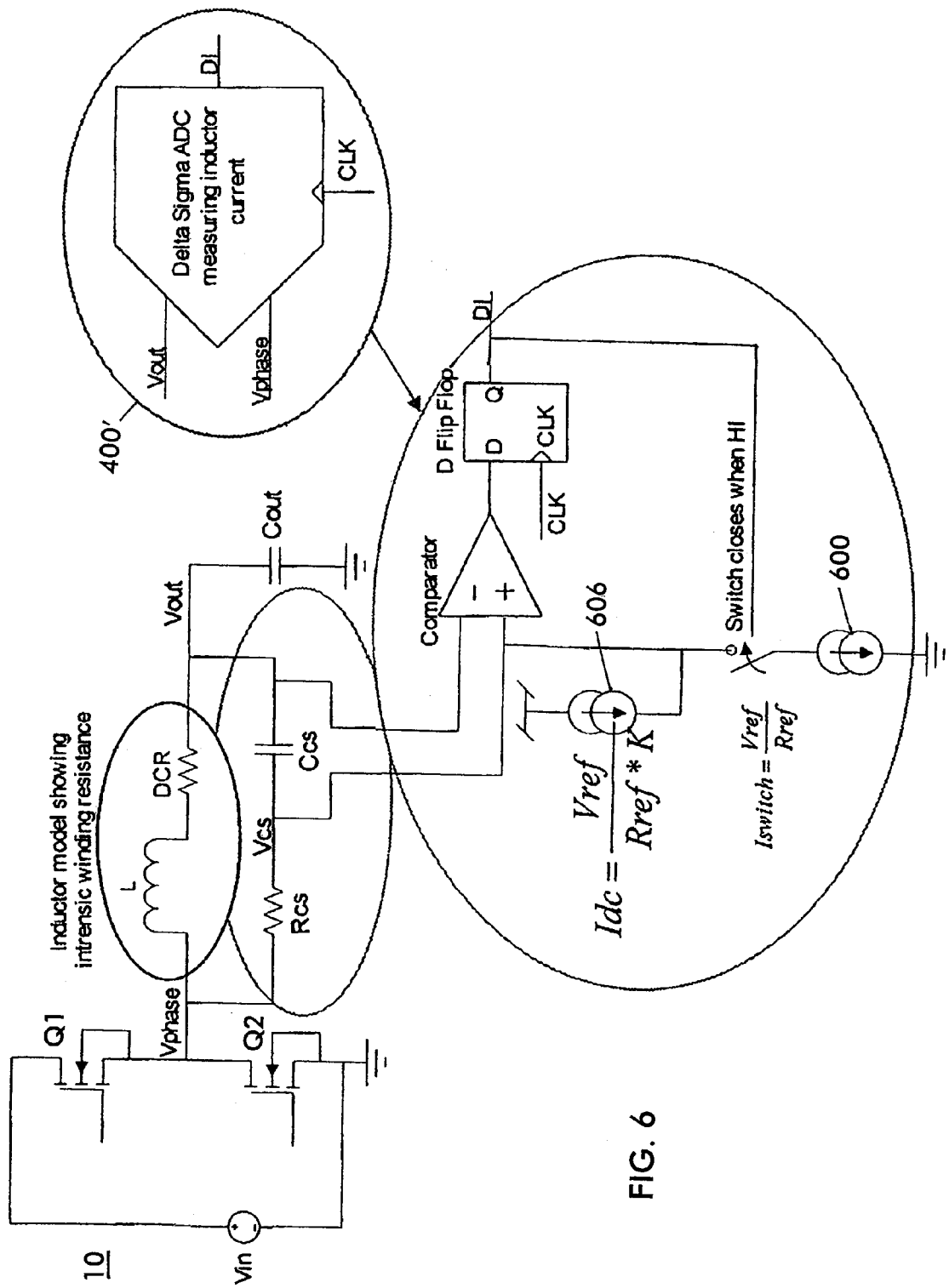
FIG. 6 is a circuit diagram of a digital current sensing circuit configured for positive and negative inductor current.

The ADC 12a may be implemented in a manner similar that of the circuit of FIG. 6, for example. The ADC 12b is preferably similar to the circuit illustrated in FIG. 5. FIG. 5 illustrates a specific example of a delta sigma ADC circuit 500 configured to measure a single ended voltage (voltage with respect to ground). This configuration would be useful, for example, for digitizing the output voltage (Vout) of a switching power supply, for example, the buck converter 10 of FIG. 1. As is noted above with regard to the current measuring sigma delta ADC 400' of FIG. 6, since the feedback loop (including the comparator, flip flop and source) holds the inputs of the comparator to be substantially equal, the steady state (average over many clock cycles) operation of the circuit of FIG. 5 can also be analyzed relatively easily based on the following equations:

$$Vx = Vout \quad \text{Equation 15}$$

summing the current at node Vx results in:

$$Vx/R2 = I*DV \quad \text{Equation 16}$$

Since I is defined as Vref/R1 the result can be expressed as:

$$Vx/R2 = Vref/R1*DV \quad \text{Equation 17}$$

Then, presuming that the loop gain is sufficiently large and the filter R2*Cfilter time constant is sufficiently large compared to the sampling frequence:

$$Vx = Vout \quad \text{Equation 18}$$

Solving for DV yields:

$$DV = Vx*R1/R2 \quad \text{Equation 19}$$

Substituting Vx for Vout results in:

$$DV = Vout*R1/R2 \quad \text{Equation 20}$$

Thus, the output (DV) of the delta sigma ADC circuit 500 in FIG. 5, for example, is merely a function of the output voltage (Vout) and constants R1, R2. Solving for Vout, therefore we get:

$$Vout = DV*R2/R1 \quad \text{Equation 21}$$

Figure 2:
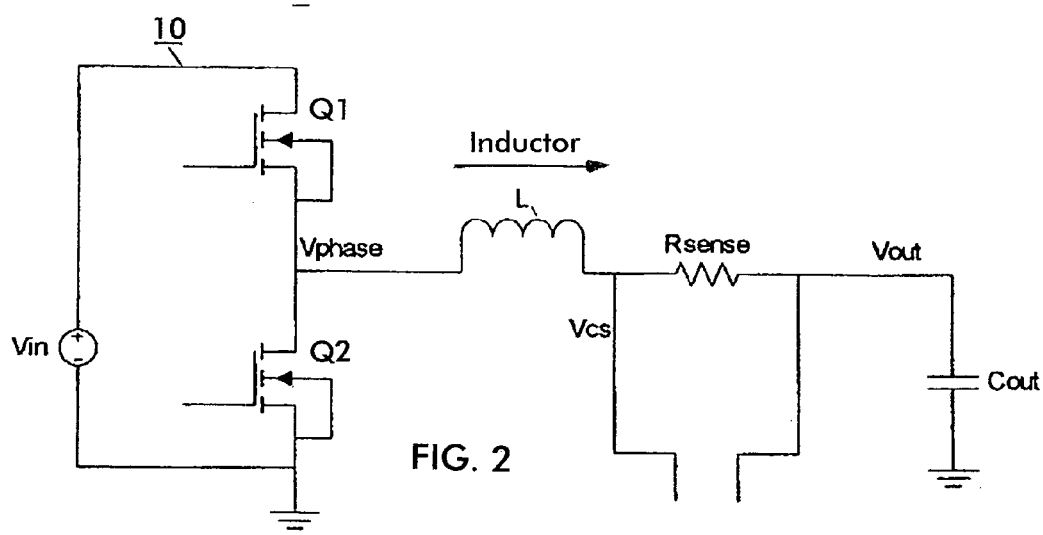
FIG. 2 is a circuit diagram of a commonly known switching power supply providing resistor sensing.
Figure 3:
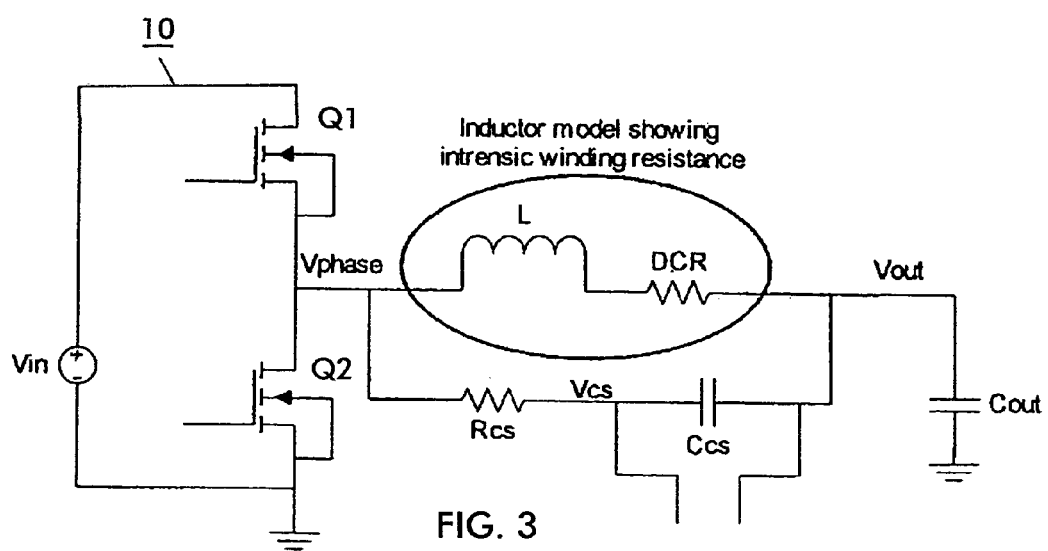
FIG. 3 is a circuit diagram of a commonly known switching power supply providing DCR current sensing.
Figure 4:
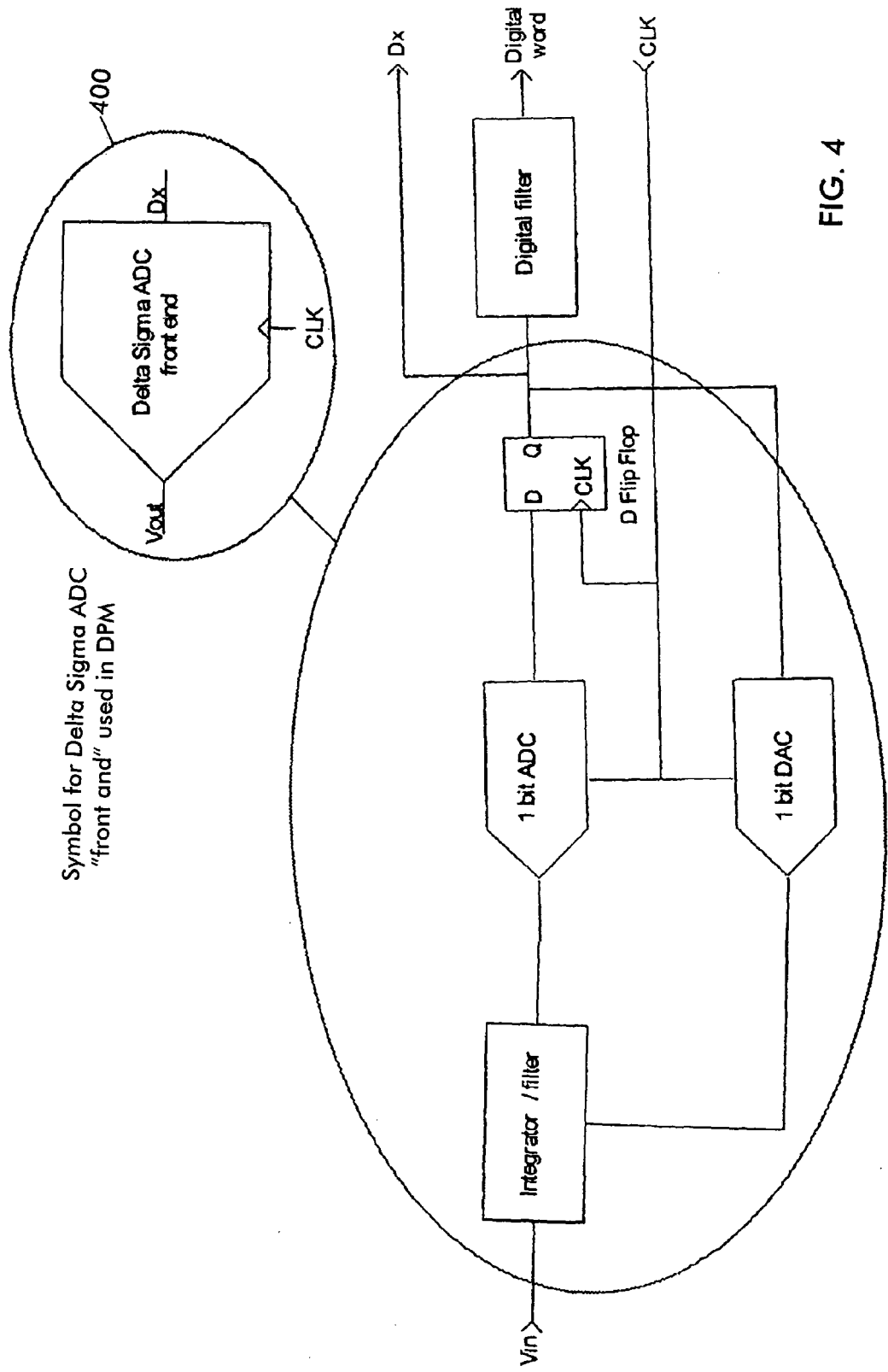
FIG. 4 is a circuit diagram of an exemplary delta sigma analog to digital converter circuit.

In a preferred embodiment, the power monitoring circuit 100 of FIG. 7 is preferably provided with the output voltage (Vout) of the power supply and current sense signal (Vcs), such as that provided in the circuit of FIG. 2 or 3, for example, which is indicative of the current through the output inductor L.

Each of the two delta sigma ADC circuits 12a, 12b provides a continuous stream of digital ones and zeros in the output signals DI and DV, respectively. For the ADC 12a the ratio of ones to zeros in the output DI signal contains information regarding the current through the output inductor L. The output of the second ADC 12b indicates the voltage at the output of the switching power supply (Vout) and yields a continuous stream of ones and zeros in the output signal DV in which the ratio of one's to zeros contains information about the output voltage Vout.

The convolver circuit 14 is a clocked digital circuit which, in effect, multiplies, in real time, the current information in the DI signal with the voltage information in the DV signal to provide a new synchronous stream of ones an zeros (DP) in which the ratio of ones to zeros contains information regarding the power delivered through the inductor L. It is noted that the convolver circuit 14 also provides for some averaging as well. Thus, the circuit 100 of FIG. 7 provides a single digital signal that supplies information regarding the power dissipated by the inductor L in a switching power supply. The counter 16 and the interval circuit 18 act as a filter and may be used to provide further averaging of the digital power signal DP, if desired, in conjunction with the latch 19.

Convolution is a well known mathematical concept. In its simplest form, convolution merely entails multiplication of two bits, which may be implemented with a logical AND function. The following is the truth table for the logical AND function:

| A | B | A and B |
|---|---|---------|
| 0 | 0 | 0 |
| 0 | 1 | 0 |
| 1 | 0 | 0 |
| 1 | 1 | 0 |

When this logic function is applied to the digital signals DI and DV to convolve these signals, the result is:

| DI | DV | DI convolve DT |
|----|----|----------------|
| 0  | 0  | 0 |
| 0  | 1  | 0 |
| 1  | 0  | 0 |
| 1  | 1  | 1 |

On average, if the bit streams DI and DV were ANDed together, the resulting bit stream would have an average ones density equal to the product of the ones density of the first stream (DI) multiplied by that of the second stream (DV). This is illustrated, for example, in the table of FIG. 8. As illustrated in FIG. 8, the first sample of the first bit stream (DI) is zero, the second is one, the third is zero, the fourth is one etc. Thus, the one's density of the signal DI is 50% (0.5). The bit stream DV has a bit stream of all ones. The ones density of DV is 100% (1.0). Since each bit stream represents a single numerical average (over a defined sampling interval) it is expected that bit density of the bit stream that results from the convolution would be the product of the ones densities of the input bit streams. In the example of FIG. 8, this is correct and the resulting bit stream DP has a ones density of 0.5 (0.5*1). Application of a logical AND to two bit streams is a form of discrete convolution and will generally be referred to herein as "one bit convolution".

However, using such a one bit convolution method may not work well in all cases. For example, in the examples illustrated in FIGS. 9A, and 9B, a ones density of both inputs (DI, DV) is selected as 50% (0.5). However, since these digital signals DI, DV are the result of real world analog signals (Vcs and Vout), the phase alignment of the bit streams in DI, DV is unknown. Even assuming that the bit streams have the highest possible frequency content, that is, 0.5 will always be represented as 01010101 as opposed to some other lower frequency content such as 00110011, there are problems that can arise if the streams are out of phase.

The phase alignment of the two uncorrelated bit streams has an important impact on the convolution result. As illustrated in FIGS. 9A and 9B, the result (DP) of the convolution of these bit streams can have a ones density of 0% or 50% depending on alignment. However, the correct answer, that is the one that is based on a multiplication of the average ones density of each signal is 25% (0.5*0.5=0.25). It is noted that incorrect outcomes based on phase alignment problems will always have a complimentary outcome that is incorrect by the same amount in the opposite direction. For example, in the bits streams of FIGS. 9A and 9B, as is noted above, the two incorrect results 0 and 0.5 are off by the same amount, in opposite directions, from the proper result 0.25. Given enough time, and the introduction of sufficient noise, these incorrect phases will appear equally in the system and cancel, however, this may take more time than is allowable. The process can be expedited by increasing the number of samples that are convolved. That is, the use of multiple bit convolution may be preferable in the convolver circuit 14.

For example a two bit convolver circuit may be used and will perform two AND operations. The first AND operation is performed on the two current bits, one from each stream DI, DV. The second AND operation is on the current bit from one stream and the previous bit from the other stream. This two step convolution is illustrated in FIGS. 10A and 10B. The result of the two bit convolution is always correct as can be seen in FIGS. 10A and 10B. However, with more complex bit streams, the problem may still persist. For example, with a bit stream having a pattern that repeats every 4 bits (0001000100010001), it would require a 4-bit convolver to always product an output bit stream with the correct density without waiting for chance and probability to change the alignment. Such an multiple bit convolver circuit may be used if desired, however there are drawbacks to this as well.

It is noted that it is important in measuring power to provide real-time multiplication. For example, FIG. 11 illustrates two continuous time signals I(t) and V(t) and their averaged signals (Avg(I(t)), Avg(V(t))). Although the average of each of the continuous signals is 50%, that is, the ones density when digitized is 50% (0.50), at any give instant the product is zero. That is, the product of two averages is not equal to the average of two products.

$$\int A^* \int B \neq \int (A^*B) \qquad \text{Equation 22}$$

For transient signals, that is, where the frequency content is higher than the sampling interval, taking a product before averaging is more accurate than averaging and then taking the product. Convolution solves this problem by multiplying instantaneous current by instantaneous voltage (DI*DV) over a relatively small time interval (the convolution interval). However, there is still some measurable non-instantaneous interval over which it acts. This can be seen in FIG. 12, for example. The larger the convolver circuit, that is, the more bits it convolves and the longer the convolution interval, the more correct it is in terms of averaging out bit stream patterns quickly, however, the downside to these larger convolution intervals is that the system behaves more like one which averages first and then multiplies. Nonetheless, convolution has significant advantages over systems that average separately or that multiply in the analog domain and then average. Thus, the size of the convolver circuit 16 may be selected based on a particular applications tolerance for the problems described above.

The present circuit 100 may be used with ADCs that are capable of resolving both positive and negative inductor currents as well, for example using the DCS method described above with reference to FIG. 6. In this case, the counter 16 is preferably modified to account for such negative current measurements.

In an alternative embodiment, illustrated in FIG. 16, for example, a multiplexor 15 (MUX) may be provided in front of the counter 16 so that any of the following signals may be digitized, DI, DV or DT. In this context, "digitized" refers to a signal which provides digital words or values, rather than a signal that merely includes ones and zeros, since, as is noted above, all of the signals DI, DV and DP are digital signals including a continuous stream of ones and zeros. This modification could be useful in adapting the circuit 100 to be used with currently existing digital circuitry, and thus, a minimal amount of new circuitry is necessary to add significant functionality to the concept.

In another embodiment, an analog output voltage proportional to the inductor current, output voltage or power signal may be used. That is the digital signals DI, DV or DP can very easily be converted into an analog voltage which is proportional to the digital signal, generally indicated by Dx, in the conversion circuit 130 of FIG. 13. In the conversion circuit 130 of FIG. 13, the signal Dx is provided as an input to a switching stage having high- and low-side switches Q3 and Q4 connected at a node to provide a voltage Vdx. An output filter including series connected resistor Rfilt and capacitor Cfilt is connected between the node and the ground. The graph portion of FIG. 13 shows the Dx output voltage of the circuit VavgDx when Dx is at 25%, 50%, and 75% ones density.

Prior art power monitoring devices have been known which use analog current and voltage measuring and analog multiplication followed by analog to digital conversion to provide a digital signal representative of the power through the inductor. Analog multiplication, however tends to be rather slow and inaccurate. Other monitoring circuits have implemented ADC current and voltage measurement over a time interval followed by digital multiplication, thus providing averaging before multiplication, which is not preferred. Still other circuits have provided full ADC multiplexing between measuring current over an averaging interval and switching to voltage measurement and then providing digital multiplication. These circuits thus also provide for averaging prior to multiplication. Other known circuits provide high speed full ADC current and voltage measuring followed by digital multiplication and digital averaging, however, such high speed analog to digital conversion increases power consumption and component number and cost.

In contrast the digital power monitoring circuit 100 of the present application provides real power averaging, that is, the multiplication occurs prior to the averaging. Further, high speed analog to digital conversion is unnecessary to provide good results. Bandwidth and stability can be easily controlled based on the clock signal without the need for an analog loop. Since the results are in digital form, the circuit is inherently resistant to noise common in analog circuits. In addition, accuracy is improved since the analog components that typically contribute to inaccuracy, such as additional comparators, reference voltages and current sources in the monitoring circuit are minimized. The circuit also has fewer components, and thus, results in less power consumption and space. Thus, if it were to be integrated into an integrated circuit (IC), a minimal number of board components are necessary to implement the circuit.

FIG. 14 illustrates a schematic of a circuit used to simulate the digital power monitoring circuit of the present application. The test simulation was performed using a test IC referred to as the IR3720TCC1 and a convolver design implemented in a field-programmable gate array (FPGA). FIG. 15 illustrates waveforms derived from the simulation circuit of FIG. 14. As can be seen with reference to FIG. 15 the simulation indicates excellent results for the digital power monitoring circuit of the present application.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A digital power monitoring circuit for monitoring power through an output inductor of a switching power supply comprises:
    a first analog to digital converter receiving a current sense signal indicative of the current through the output inductor and providing a first digital signal including information regarding the current through the output inductor;
    a second analog to digital converter receiving a signal indicative of the output voltage of the switching power supply and providing a second digital signal containing information regarding the output voltage of the switching power supply; and
    a convolver circuit operable to receive the first digital signal and the second digital signal and to provide a third digital signal including information regarding the power dissipated across the output inductor based on the first and second digital signals;
    wherein said convolver circuit convolves said first digital signal with said second digital signal to produce said third digital signal.

2. The digital power monitoring circuit of claim 1, further comprising a filter circuit operative to filter the third digital signal and to provide an output indicative of an average power dissipated by the output inductor.

3. The digital power monitoring circuit of claim 2, wherein the filter circuit comprises:
    a counter that receives the third digital signal;
    an interval timer operable to provide an interval signal to the counter after a defined averaging interval, wherein the interval signal resets the counter such that the output of the counter indicates the average power dissipated by the output inductor over the interval; and
    a latch circuit operable to output and hold the average power dissipated based on the interval signal from the interval timer.

4. The digital power monitoring circuit of claim 1, wherein the first analog to digital converter is a first delta sigma type analog to digital converter and the first digital signal is a continuous stream of ones and zeros where the ones density reflects information regarding the current through the output conductor.

5. The digital power monitoring circuit of claim 4, wherein the second analog to digital converter is a second delta sigma type analog to digital converter and the second digital signal is a continuous stream of ones and zeros where the ones density reflects information regarding the output voltage of the switching power supply.

6. The digital power monitoring circuit of claim 5, further comprising a current sense circuit connected to the switching power supply and operable to provide a current sense signal having a voltage that is indicative of the current through the output inductor of the switching power supply.

7. The digital power monitoring circuit of claim 6, wherein the first delta sigma analog to digital converter receives the current sense signal and the output voltage and provides the first digital signal based on a comparison between the current sense signal and the output voltage.

8. The digital power monitoring circuit of claim 7, wherein the second delta sigma analog to digital converter receives the output voltage as an input and provides the second digital signal based on a comparison of the output voltage to a reference voltage.

9. The digital power monitoring circuit of claim 1, wherein the convolver circuit provides single bit convolution.

10. The digital power monitoring circuit of claim 9, wherein the convolver circuit comprises an AND gate that receives the first and second digital signals as inputs and provides the third digital signal as an output.

11. The digital power monitoring circuit of claim 9, wherein the convolver circuit provides multiple AND gates that receive the first and second digital signals as inputs and provide the third digital signal as an output.

12. The digital power monitoring circuit of claim 1, wherein the convolver circuit provides multiple bit convolution.

13. The digital power monitoring circuit of claim 1, wherein the digital power monitoring circuit is implemented in an integrated circuit.

14. The digital power monitoring circuit of claim 1, wherein the switching power supply and the digital power monitoring circuit are implemented in a single integrated circuit.

15. The digital power monitoring circuit of claim 1, further comprising:
    a multiplexor provided with the first digital signal, the second digital signal and the third digital signal as inputs and operative to selectively provide one of the first digital signal, the second digital signal and the third digital signal an output signal.

16. The digital power monitoring circuit of claim 15, further comprising:
    a filter circuit connected to an output of the multiplexor and operative to filter the output signal of the multiplexor circuit to provide an filter output signal that is indicative of an average of one of the first digital signal, the second digital signal and the third digital signal based on which of these digital signals is selectively provided as the output signal of the multiplexor.

* * * * *